(12) United States Patent
Warburton et al.

(10) Patent No.: US 10,816,587 B2
(45) Date of Patent: Oct. 27, 2020

(54) METHOD AND APPARATUS FOR EVALUATING SUPERCONDUCTING TUNNEL JUNCTION DETECTOR NOISE VERSUS BIAS VOLTAGE

(71) Applicant: XIA LLC, Hayward, CA (US)

(72) Inventors: William K. Warburton, Oakland, CA (US); Jackson T. Harris, Berkeley, CA (US)

(73) Assignee: XIA LLC, Hayward, CA (US)

( * ) Notice: Subject to any disclaimer, the term of this patent is extended or adjusted under 35 U.S.C. 154(b) by 1008 days.

(21) Appl. No.: 15/141,681

(22) Filed: Apr. 28, 2016

(65) Prior Publication Data

US 2016/0245852 A1 Aug. 25, 2016

Related U.S. Application Data

(62) Division of application No. 13/155,301, filed on Jun. 7, 2011.

(60) Provisional application No. 61/408,499, filed on Oct. 29, 2010.

(51) Int. Cl.
*G01R 29/26* (2006.01)

(52) U.S. Cl.
CPC .................. *G01R 29/26* (2013.01)

(58) Field of Classification Search
CPC .................................................. G01R 29/26
See application file for complete search history.

(56) References Cited

U.S. PATENT DOCUMENTS

| | | |
|---|---|---|
| 4,349,796 A | 9/1982 | Chin et al. |
| 4,588,947 A | 5/1986 | Ketchen |
| 4,990,914 A | 2/1991 | Giancarlo |

(Continued)

FOREIGN PATENT DOCUMENTS

WO 2012/058449 A1 5/2012

OTHER PUBLICATIONS

Final Office Action for 13/155,301, filed Jun. 7, 2011 dated Mar. 8, 2016, 8 pages.

(Continued)

*Primary Examiner* — Alexander Satanovsky
(74) *Attorney, Agent, or Firm* — Kilpatrick Townsend & Stockton LLP

(57) ABSTRACT

A technique for characterizing the noise behavior of a superconducting tunnel junction (STJ) detector as a function of its applied bias voltage $V_b$ by stepping the STJ's bias voltage across a predetermined range and, at each applied bias, making multiple measurements of the detector's current, calculating their mean and their standard deviation from their mean, and using this standard deviation as a measure of the STJ detector's noise at that applied bias. Because the method is readily executed under computer control, it is particularly useful when large numbers of STJ detectors require biasing, as in STJ detector arrays In a preferred implementation, the STJ is measured under computer control by attaching it to a digital spectrometer comprising a digital x-ray processor (DXP) coupled to a preamplifier that can set the STJ's bias voltage $V_b$ using a digital-to-analog converter (DAC) controlled by the DXP.

27 Claims, 7 Drawing Sheets

(56) References Cited

U.S. PATENT DOCUMENTS

| | | | |
|---|---|---|---|
| 5,134,309 A | 7/1992 | Matsumoto et al. | |
| 5,381,001 A | 1/1995 | Perryman et al. | |
| 5,388,068 A | 2/1995 | Ghoshal et al. | |
| 5,424,656 A | 6/1995 | Gibson et al. | |
| 5,684,850 A | 11/1997 | Warburton et al. | |
| 5,737,077 A | 4/1998 | Lee et al. | |
| 5,774,522 A | 6/1998 | Warburton | |
| 5,870,051 A | 2/1999 | Warburton et al. | |
| 5,873,054 A | 2/1999 | Warburton et al. | |
| 6,073,085 A | 6/2000 | Wiley et al. | |
| 6,208,278 B1 | 3/2001 | Toosky | |
| 6,208,950 B1 | 3/2001 | Chiba | |
| 6,256,403 B1 * | 7/2001 | Florent | G06T 5/20 382/128 |
| 6,359,511 B1 | 3/2002 | Phanse et al. | |
| 6,365,912 B1 * | 4/2002 | Booth | H01L 39/228 257/30 |
| 6,528,814 B1 | 3/2003 | Frank et al. | |
| 7,019,372 B2 | 3/2006 | Goldie | |
| 7,678,260 B1 | 3/2010 | Yang et al. | |
| 8,571,614 B1 | 10/2013 | Mukhanov et al. | |
| 2001/0042831 A1 | 11/2001 | Wood et al. | |
| 2003/0173562 A1 | 9/2003 | Goldie | |
| 2003/0194244 A1 | 10/2003 | Doh et al. | |
| 2005/0098773 A1 | 5/2005 | Vion et al. | |
| 2005/0184238 A1 | 8/2005 | Odawara et al. | |
| 2006/0088068 A1 | 4/2006 | Farrell et al. | |
| 2006/0102842 A1 | 5/2006 | Hoehne | |
| 2006/0104419 A1 | 5/2006 | Sasayama et al. | |
| 2006/0175529 A1 | 8/2006 | Harmon et al. | |
| 2007/0120563 A1 | 5/2007 | Kawabata et al. | |
| 2008/0048902 A1 | 2/2008 | Rylov et al. | |
| 2008/0059088 A1 | 3/2008 | Atanackovic et al. | |
| 2008/0204757 A1 | 8/2008 | Manning | |
| 2009/0006028 A1 | 1/2009 | Sugawara et al. | |
| 2009/0259116 A1 | 10/2009 | Wasserman et al. | |
| 2010/0051812 A1 | 3/2010 | Kawano et al. | |
| 2010/0094625 A1 | 4/2010 | Mohammad et al. | |
| 2010/0219888 A1 | 9/2010 | Lesso | |
| 2010/0226174 A1 | 9/2010 | Kim et al. | |
| 2010/0226474 A1 * | 9/2010 | Yamakawa | A61B 6/032 378/5 |
| 2011/0193576 A1 | 8/2011 | Cheng | |
| 2011/0205535 A1 | 8/2011 | Soller et al. | |
| 2011/0221533 A1 | 9/2011 | Lesso | |
| 2011/0251828 A1 | 10/2011 | Scoullar et al. | |

OTHER PUBLICATIONS

S. Friedrich et al., "Single Photon Imaging Spectrometers Using Low Noise Current Preamplifiers with DC Voltage Bias", IEEE Trans. Appl. Superconductivity 7 (1997) 3383-3386.

S. Friedrich, M.F. Cunningham, M. Frank, S.E. Labov, At.T. Barkknecht, and S.P. Cramer, "Fiske modes in superconducting tunnel junction detectors", Nucl. Instr. & Methods in Phys. Research A444 (2000) 151-155.

S. Friedrich, "Cryogenic X-ray detectors for synchrotron science", J. Synchrotron Radiation (2006) 13, 159-171.

S. Friedrich, O.B. Drury, S.P. Cramer & G.G. Green, "A 36-pixel superconducting tunnel junction soft X-ray detector for environmental science applications", Nucl. Instr. & Methods in Phys. Research A559 (2006) 776-778.

L Fabris, N.W. Madden & H. Yaver, "A fast, compact solution for low noise charge preamplifiers", Nucl. Instr. & Methods in Phys. Research A424 (1999) 545-551.

C.A. Mears, S.E. Labov & A.T. Barfknecht, "Energy-resolving superconducting x-ray detectors with charge amplification due to multiple quasiparticle tunneling", Appl. Phys. Lett. 63 (1993) 2961-2963.

International Preliminary Report on Patentability for International PCT Application No. PCT/US2011/058121, dated May 10, 2013, 10 pages.

The International Search Report and the Written Opinion of the International Searching Authority for PCT Application No. PCT/US2011/058121, dated Feb. 21, 2012, 12 pages.

Non-final Office Action for 13/155,301, filed Jun. 7, 2011 dated Jan. 7, 2016, 5 pages.

Non-final Office Action for 13/155,301, filed Jun. 7, 2011 dated Aug. 19, 2015, 16 pages.

Non-final Office Action for 13/155,301, filed Jun. 7, 2011 dated Dec. 23, 2013, 39 pages.

* cited by examiner

METHOD AND APPARATUS FOR EVALUATING SUPERCONDUCTING TUNNEL JUNCTION DETECTOR NOISE VERSUS BIAS VOLTAGE

CROSS-REFERENCES TO RELATED APPLICATIONS

This application is a divisional of U.S. patent application Ser. No. 13/155,301, filed Jun. 7, 2011, entitled "Method and Apparatus for Evaluating Superconducting Tunnel Junction Detector Noise versus Bias Voltage," which claims the benefit of U.S. Provisional Patent Application No. 61/408,499, filed Oct. 29, 2010, entitled "Method and Apparatus for Evaluating Superconducting Tunnel Junction Detector Noise versus Bias Voltage."

The entire disclosures of the above applications are incorporated by reference herein for all purposes.

STATEMENT AS TO RIGHTS TO INVENTIONS MADE UNDER FEDERALLY SPONSORED RESEARCH OR DEVELOPMENT

The U.S. Government has rights in this invention pursuant to Contract No. DE-SC0002256 awarded by the Department of Energy.

BACKGROUND OF THE INVENTION

The present invention relates generally to the operation of the class of athermal cryogenic detectors generally known as superconducting tunnel junction (STJ) detectors. More particularly, it relates to determining effective STJ detector operating points, which are low noise regions in the STJ detector's current-voltage (I-V) curve, by means of stepping the STJ's bias voltage across a predetermined range and, at each step, making multiple measurements of the current, computing their mean, their standard deviation from their mean, and using this standard deviation as a measure of the STJ detector's noise at that applied bias. Because the method is readily executed under computer control, it is particularly useful when large numbers of STJ detectors require biasing, as in STJ detector arrays.

The Operation of Superconducting Tunnel Junction (STJ) Detectors

A introduction to the properties of STJ's as detectors can be found in Friedrich [FRIEDRICH—2006A]. Briefly, a typical STJ detector consists of a 5 layer sandwich of materials: 1) a thick layer of a wide bandgap superconductor A, such as Ta or Nb; 2) a thin layer of a narrow bandgap superconductor B, such as Al; 3) a very thin layer of an insulator, such as aluminum oxide; 4) another thin layer of superconductor B; and 5) another layer of superconductor A. When an energetic particle or photon deposits energy E in layer 1, it breaks Cooper pairs to excite excess free quasi-particle charge carriers above the superconducting energy gap $\Delta$, the number of carriers being $E/\varepsilon$, where $\varepsilon$ is approximately $1.7\Delta$. The excess carriers diffuse to the Al/Al-oxide junction, where they are trapped by the change in bandgap between layers 1 and 2. Because the oxide layer is so thin, a large fraction of the carriers can then tunnel across it into layer 4, which, if the STJ is biased by a applied voltage, will be seen as a temporary tunneling current. Due to the peculiarities of superconductors, the quasiparticle charge carriers can actually tunnel back and forth across the junction multiple times, each time increasing the tunneling current. [MEARS—1993] FIG. 1 illustrates such a current pulse. Because the pulse decay time is short, STJ detectors can be operated at counting rates of 20,000/second or more, which is very high compared to thermal cryogenic detectors such as microcalorimeters.

STJ detectors are very high resolution detectors because the superconducting bandgap is so small, of order 1 MeV, so that $\varepsilon$ is of order 2 MeV. Thus the number N of excited charges produced is much larger, by factors of 1000 or more, than in the case of semiconductor detectors, where $\varepsilon$ is of order 2 eV, or gas detectors, where $\varepsilon$ is of order 20 eV. Since the standard deviation in N scales as sqrt(N), the energy resolution improves accordingly. For example, while a good semiconductor detector's energy resolution at 6 keV is 120 eV, a good STJ detector can do better than 10 eV. To achieve this operation, the detectors are operated at temperatures of order 0.1 K, both so that the superconductors will be superconductors and so that thermal excitation of the charge carriers will be negligible.

Fiske Mode Issues in STJ Detectors

A difficulty in employing STJ detectors is that they display Fiske mode resonances at certain applied bias voltages. [FRIEDRICH 2000]. These resonances occur because layers 2 and 4 of superconductor on both sides of insulating layer 3 form a high Q RF cavity that is excited by the AC Josephson current whenever some cavity dimension matches some half integer multiple $\Phi$ of the wavelength $\lambda$ of the AC Josephson radiation, whose frequency f=486 Mhz/$\mu$V of applied bias. While it is possible to suppress one or more of these modes using the same magnetic field that is applied to the STJ to suppress the DC Josephson current, it is not possible to simultaneously suppress all of them. When the cavity is resonating the STJ does not work well as a detector because the resultant oscillating baseline current adds excess noise to the current pulse measurements. For best operation, it is therefore desirable to choose an operating point which is not close to a Fiske mode.

FIG. 2 shows a pair of example STJ detector I-V curves taken above 0 applied Volts at two different applied magnetic fields. The general trend of the I-V curve is to start with a relatively flat slope and then begin to rise exponentially at higher applied voltages. The Fiske modes are seen as sharp spikes on the curves. As the applied voltage and AC Josephson radiation frequency increases, the Fiske modes become closer and closer together until they finally overlap. The shown device is relatively large (200 $\mu$m$\times$200 $\mu$m) and thus has a high density of Fiske modes because of the low AC Josephson radiation frequency (long wavelength) needed to first satisfy the resonance criterion. As the figure shows, the different magnetic fields accentuate some Fiske modes and suppress others.

While, in principle, one could select an operating point between 0 Volts and the first Fiske mode, this is not typically desirable because the efficiency with which the excited quasi particles tunnel through the oxide layer also depends upon the applied bias voltage. This dependency begins linearly at low bias voltages and then eventually saturates at a voltage that depends upon the construction of the STJ. Therefore a preferred operating point is between a pair of Fiske modes at a bias voltage where the charge tunneling efficiency is high. In FIG. 2 this might be in the vicinity of the line marked "Load Line" at 330 $\mu$V.

Current Art for Setting STJ Detector Operating Points

The current preamplifier art for STJ detectors is typified by the circuit shown in FIG. 3, which is a simplified sketch of a preamplifier developed by Friedrich, based on earlier published work [FRIEDRICH—1997]. In this circuit, the STJ detector 10 is represented by its equivalent circuit, comprising a current source $I_d$, a capacitance $C_d$, and a resistance $R_d$. Typical values of $I_d$, $C_d$, and $R_d$, respectively, are: 100 nA/keV of deposited energy, 1 nF, and 1,000Ω. The STJ is attached to the gate of FET Q1 12, whose source is grounded and whose drain current is partially supplied through $R_2$ 15. The drain of Q1 12 is also attached to the input of low noise amplifier A1 18, whose output is fed back to the gate of Q1 through the feedback network comprising feedback resistor $R_f$ 20 (typically 1 MΩ) and feedback capacitor $C_f$ 21 (typically 0.5 pF).

Q1's gate voltage is maintained at a desired operating point through the use of a feedback loop 25. This loop uses amplifier A2-1 27 to buffer Q1's gate voltage through resistor $R_i$, 29 to an integrator 31 consisting of amplifier A2-2 and integrating capacitor $C_i$. The integrator's output connects to the drain of Q1 12 through resistor $R_{ca}$. 35 The feedback circuit works by comparing the voltage set on bias network 40 to the buffered value of Q1's gate voltage $V_{g1}$, and integrating the difference. This integrated difference voltage then drives enough additional current into Q1's drain, through $R_{ca}$, to bring Q1's gate voltage to the desired set point. The bandwidth of this feedback loop is of order 100 Hz. Since the setpoint is typically in the range of ±300 µV, the value of the potentiometer $R_{S2}$ in bias network 40 is usually much smaller than the resistors $R_{S1}$ and $R_{S3}$ (typical values: 30 KΩ, 10Ω, and 30 KΩ).

When the STJ 10 absorbs energy, the resultant tunneling current is supplied by amplifier A1 18 through the feedback resistor $R_f$ 20. In this loop, any attempt to vary the gate voltage $V_{g1}$ would produce a concomitant change in the drain-source current through Q1 via its transconductance, and this change in current, through resistor $R_2$ 15, would vary the input voltage to amplifier A1 18, which would respond by driving enough current through the feedback network 20 to cancel the attempted gate voltage variation. The effect of this feedback loop is that STJ tunneling currents are forced to flow through $R_f$, generating an output signal that is the product of $R_f$ and the tunneling current. The bandwidth of this feedback loop is of order 100 KHz, so that it does not interfere with the operation of the bias feedback loop 25. A buffer amplifier A3 45 connects this circuit's output to the outside world. A typical output pulse from this circuit was shown in FIG. 1.

In order to use this circuit to set the STJ's operating point, two additions are required. The first is a low pass (1 kHz) filter 50, using amplifier A4, that is also attached to the output of amplifier A1 18. Since, as noted above, amplifier A1 supplies the STJ's current requirements through the feedback network 20, the output of filter circuit 50 therefore also reflects the STJ's operating current. The second addition is the circuit 55 to measure the gate voltage $V_{g1}$ of Q1 12, which is also the bias voltage across the STJ 10. This circuit consists of a high impedance, FET input instrumentation amplifier 58 which does not load Q1's gate and whose output is filtered by the low pass filter using amplifier 60.

To measure the STJ's operating curve, the output of filter 50, carrying its current value, is attached to the y axis input of an x-y storage scope, while the output of filter 55, carrying its voltage value, is attached to the scope's x axis input. The input voltage to integrator 31 from bias network 40 is then scanned by hand by adjusting potentiometer $R_{S2}$ 62 over some fraction of its range. The resulting I-V curve is captured by the storage scope, whose persistence is set to "infinite". The traces shown in FIG. 2 were captured using this method. To set the STJ operating point, an I-V curve is first captured as just described. Then, since the storage scope shows the instantaneous value of I-V as a glowing dot on its screen, a desired operating point can be located on the full curve and then the dot moved to this location, using the still visible full I-V curve as a guide.

STJ Detector Arrays

Because the density of Fiske modes increases with increasing detector size, an effective upper limit on useful detector size is reached at about 200 µm×200 µm, which means that they do not have a large cross section in most radiation detection applications. The response to this has been to develop detector arrays. Friedrich et al. describe a 36 pixel array used at a synchrotron radiation beamline, for example. [FRIEDRICH—2006B] While this array produced some valuable science, it also demonstrated the issues associated with further increasing array size. Chief among them is the issue of setting the operating points for the STJ detectors in the array. Because the typical adiabatic demagnetization refrigerator used to reach the STJ's 0.1 K operating point has a holding time of 24 hours or less, the operating points on all the detectors in the array have to be reset, or at least checked, daily. While this in manageable with a 36 elements, using the circuit and technique described above, it would clearly become completely impractical at the 1000 element size being proposed for a next generation synchrotron radiation soft x-ray detector based on STJ technology.

There are several problems. First, the method is manual, requiring the attention of a skilled operator. Second, it is serial, since only one circuit can be attached to the storage scope at a time. Third, it is not reproducible, since the bias point is adjusted by hand and there is no record produced of the resultant I and V values. Thus, for example, if one wished to find an optimum operating point by making resolution measurements at several points and then return to the best setting found, this would not be possible with any precision.

Therefore, for this technology to progress, there is definite need for a method for locating STJ operating points that could be carried out under computer control in a reproducible manner and that, preferably, could also be carried out on all the detectors in the array simultaneously.

SUMMARY OF THE INVENTION

The present invention provides techniques for characterizing a superconducting tunnel junction (STJ) device with the goal of selecting a device operating point that will allow it to be effectively used as a particle or x-ray detector. In particular, the invention teaches providing a preamplifier that allows the STJ's bias voltage to be reproducibly adjusted, and then, for each of a sequence of applied bias voltages, making multiple measurements of the current flowing through the STJ and using the measured values to compute both the mean current flow and its standard deviation, the latter being a measurement of the STJ's noise at the applied bias. Bias voltages at which the device exhibits Fiske mode oscillations will display large noise values and so may be avoided when selecting an operating point.

If, in addition, the detector's energy resolution is also measured over a sequence of applied bias voltages, then the features in a plot of resolution versus bias voltage can be correlated with the features in a plot of noise versus bias voltage, allowing the latter to be used in selecting an optimum detector operating point. This is beneficial because the noise versus bias voltage curve can be collected in a tiny fraction of the time required to collect a resolution versus bias voltage curve.

The technique is readily extensible to large STJ detector arrays by using a computer to control the bias point adjustment, compute the standard deviations, and examine the resultant noise versus bias point curve for low noise regions within a pre-selected bias voltage range.

In use, each STJ will have its own preamplifier and spectrometer circuitry. If the capability for measuring current values and computing their mean and standard deviation is integrated into each spectrometer, then the process of measuring a noise versus bias voltage curve can be carried out simultaneously for all the STJ detectors in an array, independent of their number.

In the preferred implementation, the preamplifier is DC coupled, so that the computed mean current values can be used to construct a current versus bias voltage ("I-V") curve for the STJ detector at the same time as the noise versus bias voltage curve is constructed. However, if the preamplifier is AC coupled, the DC component of the I-V curve will be lost. The fluctuations in the current can still be measured, though, and so the technique will still produce a valid noise versus bias voltage curve to characterize the STJ device.

A further understanding of the nature and advantages of the present invention may be realized by reference to the remaining portions of the specification and the drawings, which are intended to be exemplary and not limiting.

DESCRIPTION OF SPECIFIC EMBODIMENTS

Preamplifier Design

Figure 1:
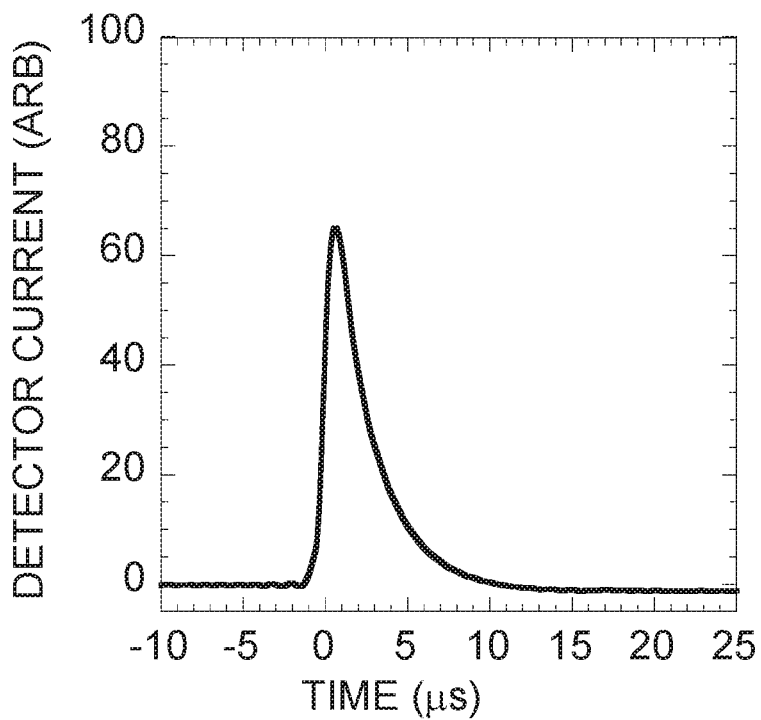
FIG. 1 shows a typical current output pulse from an STJ detector.
Figure 2:
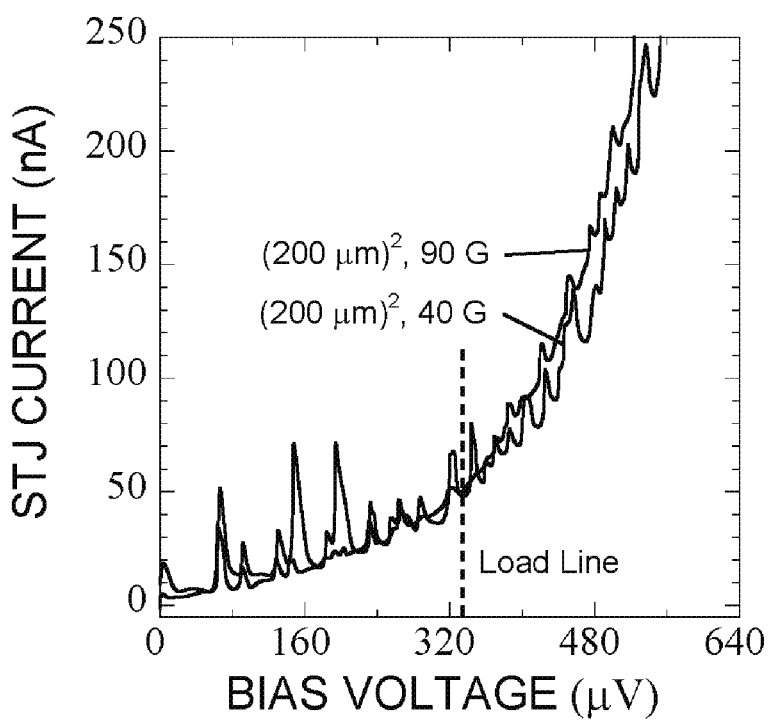
FIG. 2 shows a pair of I-V curves taken from an STJ detector at two different magnetic field values.

In order to make repeatable measurements on a superconducting tunnel junction (STJ) detector as a function of applied bias voltage, it is first necessary to supply a preamplifier that can adjust the STJ's bias voltage in a reproducible manner. FIG. 4 shows the schematic of a preamplifier circuit, developed for use with STJ detector arrays, that has this property. This circuit builds on a design published by Fabris et al. [FABRIS—1999] by adding a feedback loop to set and control the STJ's operating point, as described by Friedrich et al. [FRIEDRICH—1997]. Both the circuit and feedback loop are similar in many regards to the core of the circuit shown in FIG. 3. The major differences are that: 1) whereas the circuit in FIG. 3 had a single FET Q1 12, this circuit has a cascode comprising FET Q1 80 attached to FET Q2 82; 2) the current to operate Q1 is supplied by 3 paths; and 3) whereas the integrator 31 in FIG. 3 has its offset controlled by the manually adjusted bias network 40, the circuit in FIG. 4 uses a digital-to-analog converter (DAC) 85 followed by a low pass filter (LPF) 87 for this function. Further, as in the circuit shown in FIG. 3, this circuit is DC coupled at its output.

DC Operation

Because $V_{g1}$ is in the micro-Volt range and the source of Q1 80 is grounded to avoid noise issues associated with biasing it to something other than zero, Q1 is therefore operated under the condition that its gate-source voltage $V_{gs1}$ is essentially zero, meaning that the circuit has to supply the appropriate quiescent drain-source current $I_{ds10}$, which, for the pair of BF862 transistors in parallel used in our preferred implementation, is about 28 mA. While this current could be supplied through Q2 82 and R2 86, this would require a relatively small value of R2, limiting the circuit's gain. We therefore operate Q2 82 as a source follower, setting its gate voltage $V_{g2}$ 83 to a value (1.25 V) that, when added to its gate-source voltage $V_{gs2}$ biases Q1's drain at a reasonable value (here about 2.5 V). The drain of Q2 82 is tied both the R2 86 and the positive input of operational amplifier OP1 93. Q2 has its drain-source bias set to about 2 volts by setting its drain voltage to 4.55 V by also setting $V_{ref}$ 95 on the negative input of OP1 to 4.55 V. The current $I_{R2}$ that flows through Q1 from R2 may then be found, noting that the $V_{cc}$ needs significant filtering to achieve best noise performance, from $$I_{R2}=(V_{cc}-4.55)/(R_2+R_{filter}), \qquad (1)$$

where $R_{filter}$ is the sum of the filter resistance values. In this implementation, with $V_{cc}$=12 V, $R_2$=1000 W, and $R_{filter}$=75, $I_{R2}$=6.9 mA. Therefore the remaining 21 mA must be supplied through $R_1$, whose value is computed by adjusting EQN. 1 appropriately. When the bias point $V_{g1}$ is at some value other than zero, then Q1's drain-source current $I_{ds1}$ will not equal $I_{ds10}$ and the difference will be supplied by the bias point feedback loop 115 through resistor $R_{ca}$ 130 as presented below.

Finally, in order for the circuit to hold $V_{g1}$ 75, Q1's gate voltage, close to zero, the amplifier OP1 93 has to supply the static detector current $I_{d0}$ of the STJ 10 by developing the correct value of its output voltage $V_0$ 97, which is just $I_{d0}$ times $R_f$ 101. $V_0$, therefore, is a direct measure of the STJ detector current $I_d$, with a scaling factor of 1 µA/V for the 1 MΩ value of $R_f$ 101 used in our preferred implementation. We therefore emphasize that, in the following, when we discuss measuring $V_0$ 97, we conceive of and intend this as a measurement of the detector current $I_d$ in the STJ 10 and we may speak of it as such (e.g. "measuring the detector current $V_0$").

AC Operation

The circuit works as follows. Changes in $V_{g1}$ 75 of FET Q1 80 cause changes in the current through Q1 through its transconductance $g_{m1}$. The cascode transistor Q2 82 is operated as a source follower with a constant gate-source voltage, so that the voltage at its drain is held constant compared to the bias voltage $Vg_2$ 83 at its gate. Under these conditions, the changes in current in Q1 are passed directly through Q2 and drawn from resistor R2 86, which are then seen as voltage fluctuations at the + input of operational amplifier OP1 93, which amplifies them to its output $V_O$ 97. As is well known, the use of the cascode removes the Miller effect from FET Q1 80, allowing this stage to operate at much higher gains without oscillating. The open loop gain G of this two stage circuit is given by:

$$G = g_{m1} R_2 A_1, \quad (2)$$

where $g_{m1}$ is the transconductance of Q1 80, and $A_1$ is the gain of OP1 93. With typical values of $g_{m1}$ ($0.04\Omega^{-1}$), $R_2$ ($1000\Omega$), and $A_1$ ($10^4$ at 1 MHz), G is large enough ($4\times10^5$) at the frequencies found in the current pulses so that the operating point will need to move dynamically by only a few micro-Volts in order to produce even a 1 Volt pulse output at $V_O$. This, in turn, means that we can find good operating points even between Fiske modes that are only separated by 10 or 20 micro-volts.

Figure 3:
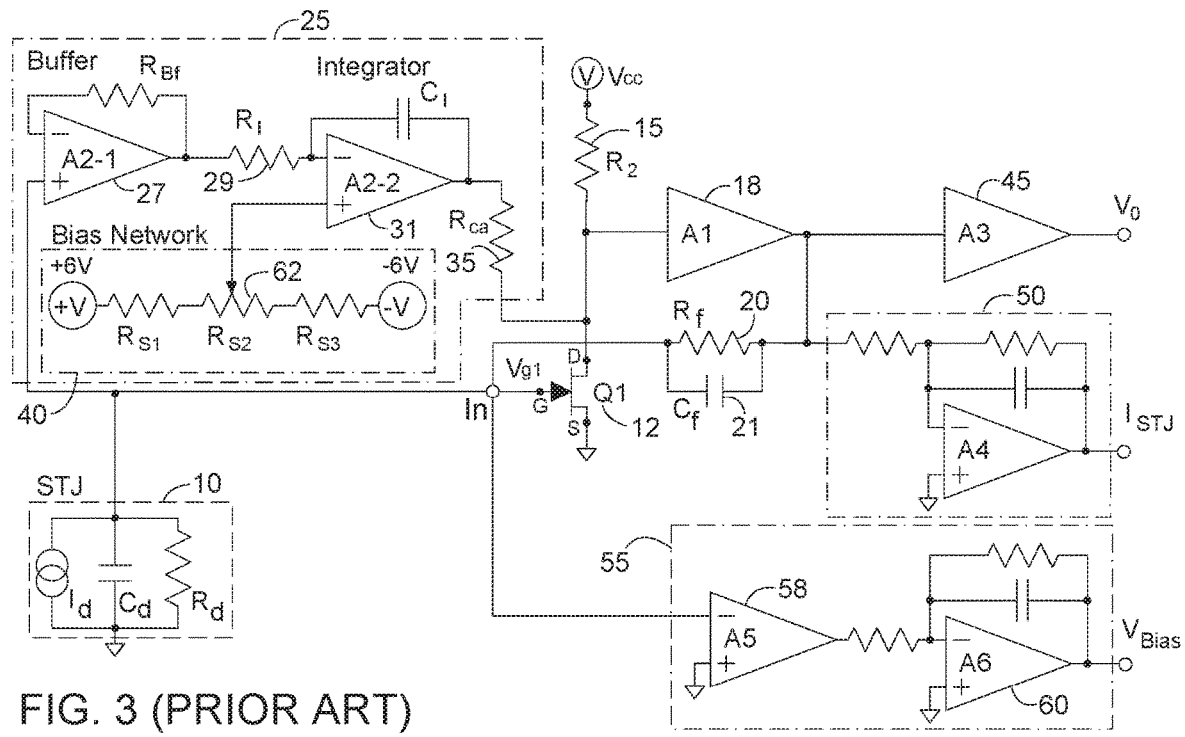
FIG. 3 shows a simplified schematic of a prior art preamplifier presently in use with an STJ detector array.
Figure 4:
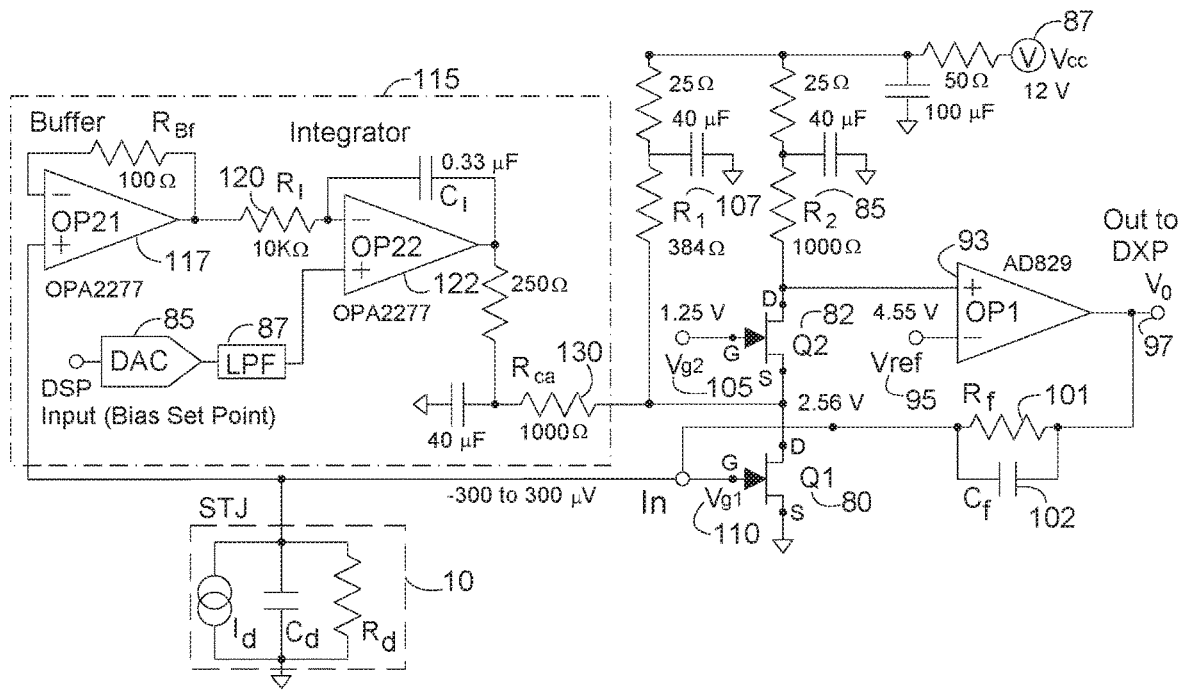
FIG. 4 shows the schematic of a preamplifier circuit designed explicitly for use with STJ detector arrays.

As in FIG. 3, the output $V_O$ 97 of OP1 93 is fed back to the gate of Q1 80 through the feedback network consisting of $R_f$ 101 and $C_f$ 102 and the same description of its operation applies. As in the DC case, then, $V_O$ remains a representation of the STJ 10 detector current $I_O$. Similarly, the operation of the STJ bias set point feedback network 115 is much the same as in FIG. 3. The Q1 gate voltage $V_{g1}$ 75 is buffered through amplifier OP2-1 117 by resistor $R_f$ 120 into an integrator using amplifier OP2-2 122, whose output is filtered and applied to the drain of Q1 through resistor $R_{ca}$ 130. The network 115 thus integrates the difference between the buffered value of $V_{g1}$ 75 and the bias set point provided through input 131 to the digital-to analog converter (DAC) 133 whose output is filtered by the low pass filter (LPF) 135. The integrator's output then adjusts the drain-source current $I_{ds1}$ of Q1 80 to cause Q1's gate voltage $V_{g1}$ 75, which is the bias to the STJ 10, to match the bias set point from DAC 133.

In practice, of course, these two voltages will not be precisely identical because of offsets in the operational amplifiers used to implement the circuit, their finite gain, etc. However, provided that these terms are relatively stable once the circuit has warmed up, this issue will not be important. This is because characteristic features in the shape of the STJ's I-V curve allows the condition of zero bias voltage to be determined directly from the I-V curve and then attributed to a particular DAC setting, thereby calibrating out all of the offsets.

Complete Measurement Circuit

Figure 5:
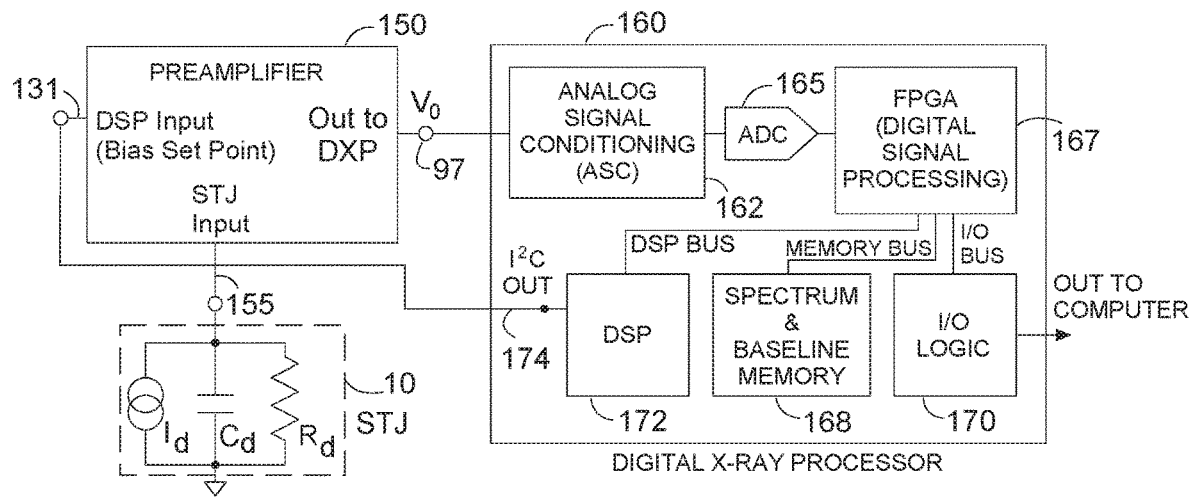
FIG. 5 shows the schematic of a spectrometer system incorporating the invention.

Using a preamplifier such as the one shown in FIG. 4, an STJ detector's I-V curve and noise parameters can be measured using a circuit like the one shown in FIG. 5. This circuit has two components, the aforesaid preamplifier 150 and commercial digital x-ray processor 160 such as the µDXP from XIA LLC. The general operation of this processor has be described in several U.S. Patents [WARBURTON 1997, 1998, 1999A and 1999B], and is well understood to those skilled in the art. Briefly, the preamplifier's input 155 is connected the STJ detector 10, while its output $V_O$ 97 is connected to the µDXP's analog signal conditioning input stage 160 which adjusts its amplitude and applies Nyquist filtering before passing the signal to an analog-to-digital converter ADC) 165.

The digitized signal is processed by a field programmable gate array (FPGA) 167 that detects pulses in the signal stream and measures their amplitude as a measure of the energy deposited in the STJ detector. Pulse values are stored in spectrum and baseline memory 168. The µDXP 160 communicates with an external computer through a block of I/O logic 170 that, depending upon the implementation, may use either RS232 or USB protocols. Logic in the FPGA 167 interprets computer commands received through the I/O logic 170 to implement such functions as "start data collection", "read spectrum memory", "change digital filtering parameters", etc. For digital computations that are not readily implemented in combinatorial logic, the FPGA 167 passes data to a digital signal processor (DSP) 172.

For example, the digital filter used to measure pulse "energies" (the "energy filter") has a zero offset value that is corrected by subtracting a "baseline" value. This baseline value is determined by making regular measurements of the energy filter's output at times when there is no pulse in the incoming data stream. These values are saved in a portion of the spectrum and baseline memory 168 and, from time to time, their mean is computed to become the current baseline. This task is carried out by the DSP 172.

Because the µDXP is a commercial device intended for OEM usage in a variety of commercial applications, it has several features intended to make it easy to integrate into those applications. For the present case, the DSP 172 has an $I^2C$ output bus 174, which is a low power serial bus standard intended to implement low cost inter-device communications. In our preferred implementation, the DAC 133 in the bias voltage feedback loop 115 in the preamplifier 150 is an $I^2C$ device. Thus, by connecting the DSP's $I^2C$ output 174 to the preamplifier's bias set point input 131, we can change the DAC's output voltage using data values sent from the µDXP 160 through its DSP 172.

STJ Noise Measurement Apparatus

Discussion of "Noise" in Conjunction with STJ Detectors

As described in the prior art discussion, the goal of using STJ detectors is to accurately measure the energy of photons or particles that interact with the detector, so our goal is to do so with as good energy resolution as possible. Traditionally, the energy resolution is considered to have two major terms, one from the process of creating charge carriers within the detectors and one from the electronic noise of the measurement circuit, where the "circuit" noise includes noise coming from the detector itself, particularly including the detector's current noise. Now, at Fiske modes, not only does the average detector current increase, but the amplitude of its fluctuations increases as well. Some of these fluctuations will fall into the frequency bandwidths of the filters that our spectrometers use to extract energy estimates from the detector's signal pulses and some will not, with only the former contributing to energy measurement's noise.

Thus the most accurate method to characterize the noise that would appear through our digital energy filters, which have the form:

$$F_i(I) = \sum_{j=i-K}^{i} I_j - \alpha \sum_{j=i-2K}^{i-K-1} I_j, \quad (3)$$

where the filtered value of I at step i is the weighted difference of the sampled values of I at earlier times, would be to use exactly this same energy filter in our noise measurements. However, the goal of our noise measurements is not to precisely measure the noise but only to detect potential operating point locations where the noise is low as. Therefore, while the filter form shown in EGN. 3 may be superior to simpler forms, it may not actually be necessary in practice. In fact, a great deal can be learned by only using the simplest filter:

$$F_i(I) = I_i, \quad (4)$$

which is not a filter at all. Which form is best in practice will be an engineering decision based on the case and the costs of implementation. Therefore, when we discuss capturing filtered value of the current, we explicitly include the case of directly measuring the current itself. We also note that, because a is not unity, $F_i(I)$ from EQN. 3 also measures the average current when applied to a DC current.

Two additions to the circuit shown in FIG. 5 are required to allow it to measure the STJ's noise properties by capturing filtered current values.

FPGA Firmware Modification

Figure 6:
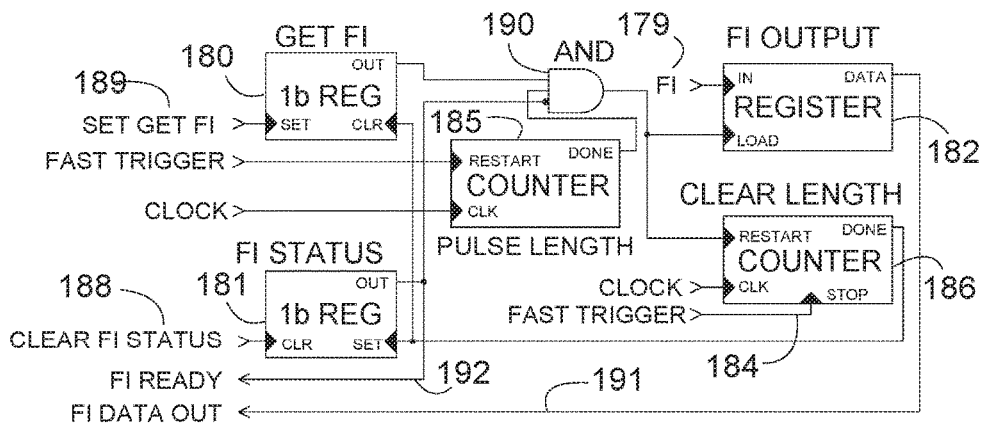
FIG. 6 shows the logic of a circuit that captures V0 values in a gate array.

First, the code in the FPGA 167 is modified with the addition of the circuit shown in FIG. 6. In this circuit, the signal FI 179 refers to a filtered current, as described in the preceding section. In our preferred implementation using a µDXP 160, FI comes from the baseline filter, which has the same parameters as the energy filter, and has the full form shown in EGN. 3 The circuit is interfaced to the DSP 172 using two 1-bit control registers, the GET FI REGISTER 180 and the FI STATUS REGISTER 181. and a 16-bit FI OUTPUT REGISTER 182. The function of the circuit is to capture a single valid baseline filter value each time it is invoked, which means that we need to assure that the circuit captures its FI sample at a time when no signal pulse is passing through the filter. We therefore need to wait for a number of clock cycles $M_{PL}$, corresponding to a time greater than the signal pulse decay time, since the last detected signal pulse before FI is valid for capture.

Now the µDXP 160 already contains, in its FPGA pulse processing circuitry 167, a fast filter expressly intended to detect the arrival of pulses into the processor [WARBURTON 1997 and 1999B]. Whenever this fast filter detects a signal pulse it emits a trigger pulse of one clock cycle duration on the signal line labeled FAST TRIGGER 184 in FIG. 6. The FIG. 6 circuit uses this signal to make two tests: 1) using PULSE LENGTH counter 185, that $M_{PL}$ clock cycles have passed since the last pulse was detected; and 2) using CLEAR LENGTH counter 186, that at least $M_{CL}$ clock cycles separate the capture of a FI value from the next detected signal pulse. The reason for the second test is that the fast filter may not detect the very beginning of the signal pulse, which may take a few clock cycles to rise above the detection threshold. Therefore, by waiting $M_{CL}$ clock cycles, we can be certain that the captured FI value is not contaminated by a pulse that has not yet been detected.

In the following description, we will only discuss the logic of the circuit. The details of implementing such circuits in practice and interfacing the various signal lines to an external processor are well known to those skilled in the art of gate array programming.

The PULSE LENGTH COUNTER 185 is preloaded with the value $N_{PL}$ and restarts counting $N_{PL}$ down to zero each time it sees a rising edge at its RESTART gate. If it successfully count down to zero, then its DONE output goes high until the next time it is restarted. DONE is therefore TRUE only if at least $N_{PL}$ clock cycles have passed since the start of the last detected signal pulse. The CLEAR LENGTH COUNTER 186 behaves similarly, except that it is preloaded with the value $N_{CL}$ and also has a STOP gate. If this STOP gate sees a rising edge before the counter has finished counting down to zero, it stops counting and the output of its DONE gate remains FALSE. The FI OUTPUT REGISTER 182 captures the digital word FI 179 at its IN input and transfers it to its DATA output whenever it sees a rising edge at its LOAD gate. The GET FI 1b REG 180 and the FI STATUS 1b REG 181 are both essentially flip-flops. A rising edge on their SET gates makes their OUT terminal TRUE, while a rising edge on their CLR gates makes their OUT terminal FALSE.

In operation, the PULSE LENGTH COUNTER 185 runs autonomously, restarting every time the FAST TRIGGER line 184 signals that a signal pulse has been detected. Whenever its DONE line is TRUE a value of FI may be validly captured. To capture a FI value, the external DSP 172 initializes the circuit by clearing the FI STATUS 1b REG 181 using the CLEAR FI STATUS line 188, so its OUT value is FALSE, and setting the GET FI 1b REG 180 using the SET GET FI line 189, so it OUT value is TRUE. If the DONE output of the PULSE LENGTH COUNTER 185 is TRUE, then the output of AND 190 goes high. Otherwise it does not go high until the PULSE LENGTH COUNTER 185 successfully detects a period of $N_{PL}$ clock ticks since the start of the last detected signal pulse.

In either case, when the output of AND 190 goes high it causes the FI OUTPUT REGISTER 182 to capture a value of FI and make it available on the FI DATA OUT line. It also causes the CLEAR LENGTH COUNTER 186 to start counting down $N_{CL}$ clock ticks. If this happens successfully, then its DONE output goes high, which sets the FI STATUS 1b REG 181 and clears the GET FI 1b REG 180. Because the OUT line on the FI STATUS 1b REG 181 is TRUE, the external DSP 172 can read this on the VO READY line 192 and, knowing that the value on FI DATA OUT 191 is valid, read it. Because the OUT line of GET FI 1b REG 180 is FALSE and the OUT line of FI STATUS 1b REG 180 is TRUE, AND 190 disables any further circuit action. We note that, if a FAST TRIGGER 184 pulse stops the CLEAR LENGTH COUNTER 186 before it reaches zero, an event which also restarts the PULSE LENGTH COUNTER 185, the circuit merely waits until the next time the PULSE LENGTH COUNTER's 185 DONE output goes high to try again to capture a FI value for output.

DSP Software Modification

Figure 7:
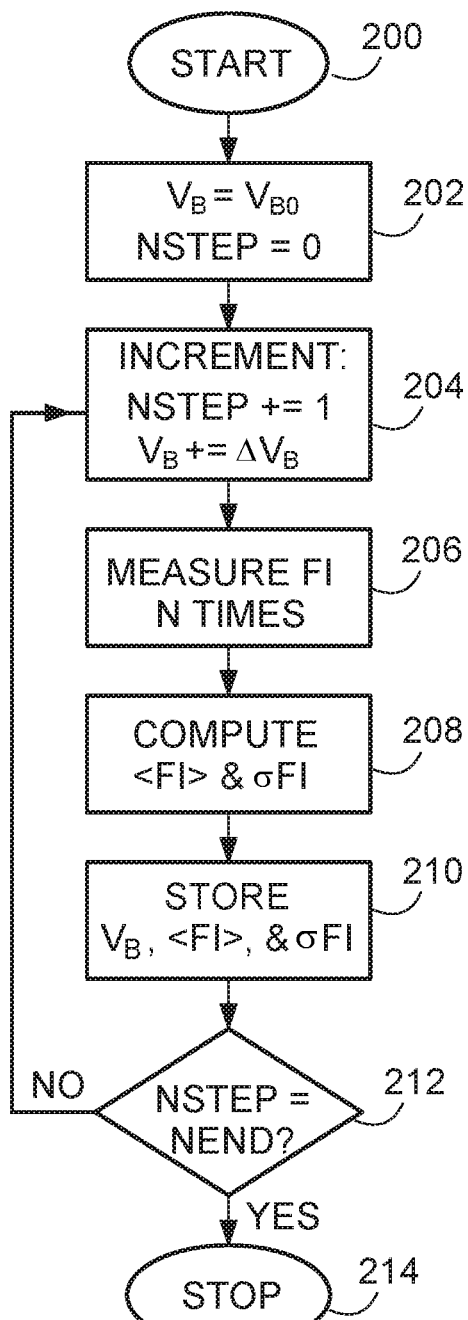
FIG. 7 shows the logic of a software routine that implements the invention.

Second, a special "measure noise" function is added to the DSP 172, where it can be called by the external computer that supplies three values: $V_{B0}$, $\Delta V_B$, and NEND. The logical flow of this subroutine is shown in FIG. 7. On entry 200, the DSP first sets the STJ's bias $V_B$ to the preselected value $V_{B0}$, using its I²C output bus 174 to set the bias set point DAC 133 and sets the counter value NSTEP to 0. It then enters a measurement loop at 204 by incrementing NSTEP by 1 and increasing $V_B$ to $V_B+\Delta V_B$. Next it measures FI 206 a fixed number N times, each time by setting GET FI 1b REG 180 and then reading FI DATA OUT 191 after it sees that the FI STATUS 1b REG 181 is set in response. The N values are stored in the DSP's working memory. In the implementation described here, N was 1000, limited by the DSP's memory size. To those skilled in the art, it will be clear that it is also straightforward, with a modest amount of additional FPGA programming, to store the captured FI values in the spectrum & baseline memory 168 if larger values of N are desired. Alternatively, DSPs with larger memories are available. Therefore the described value of N=1000 should not be taken as limiting.

After the N values of FI are collected, the DSP computes their mean <FI> and standard deviation σFI from <FI>. 208 It then passes the three values $V_B$, <FI> and σFI to the FPGA 167, which stores them 210 in the spectrum & baseline memory 168. Finally, the DSP tests whether to exit the loop or not. 212. If NSTEP=NEND, it exits the routine. Else it returns to entry point 204 to increment $V_B$ again. After the DSP exits the measurement loop it signals the external computer that it has completed the measurement, allowing the computer to recover the array of $V_B$, <FI> and σFI values from the spectrum & baseline memory 168 by making a memory read request to the FPGA 167 similar to the commands it uses to read spectral or baseline memory. The various methods for storing and transferring data between digital devices is well known to those skilled in the art and are therefore not described in detail here.

STJ Noise Measurements

Figure 8:
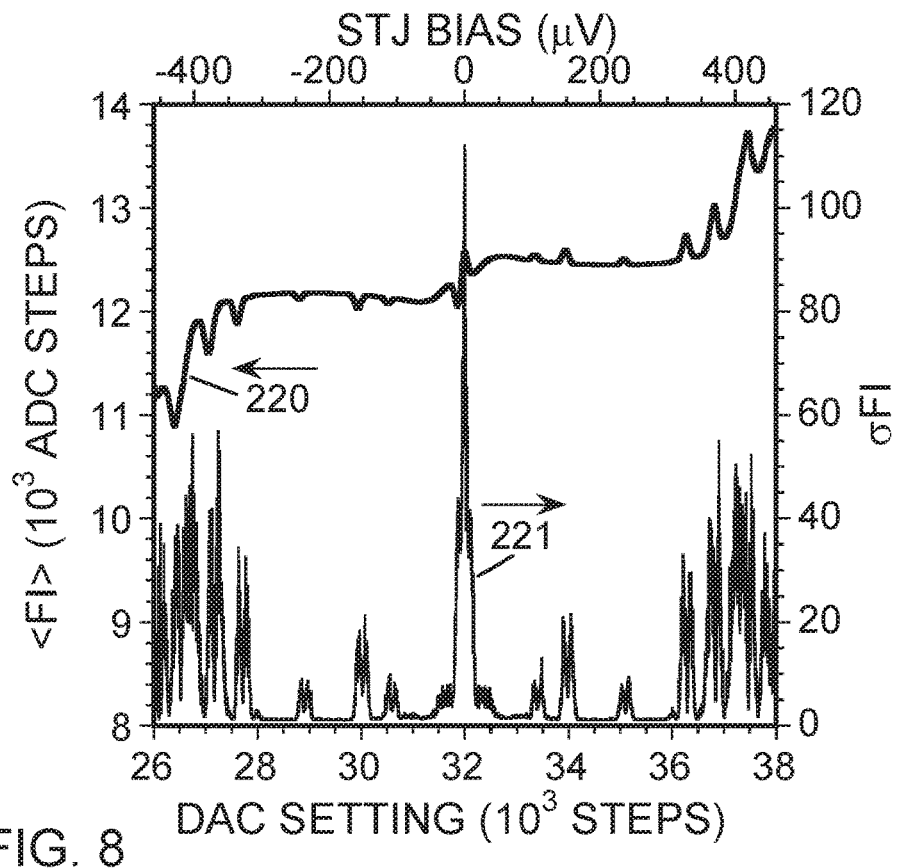
FIG. 8 shows an I-V curve and a Noise-V curve taken simultaneously from a small STJ detector using the circuit shown in FIG. 5.

FIG. 8 shows measurements made on a 70 μm×70 μm STJ using the method described above. The upper curve 220 shows the collected values of <FI> versus applied bias using the vertical scale on the left. This curve, per our earlier discussion of EQN. 3 is the STJ's I-V curve, since <FI> is proportional to <$I_{d0}$> the detector's quiescent bias current. In the following we will specifically recognize this relationship by hereafter referring to it as <$I_d$> instead of <FI> and to σ$I_d$ instead of σFI. The lower curve 221 shows the collected values of σ$I_d$ versus applied bias using the vertical scale on the right. The curve of <$I_d$> values shows an inversion at $V_B$=0 that makes this applied bias value easy to identify. This feature therefore allows us to calibrate our DAC settings without having to measure or know any amplifier offset voltages, a significant convenience. For this particular device <$I_d$>, the STJ's DC current at that applied bias, is nearly constant out to an applied bias of about 300 μV and then starts rising rapidly. The Fiske modes may be seen as small bumps on this curve. The noise curve, σ$I_d$ versus $V_B$, shows increases whose locations line up nicely with the locations of the Fiske modes in the <$I_d$> curve above. However, this curve is is much more sensitive to their presence, with the deviations being a much larger fraction of their base values.

Figure 9:
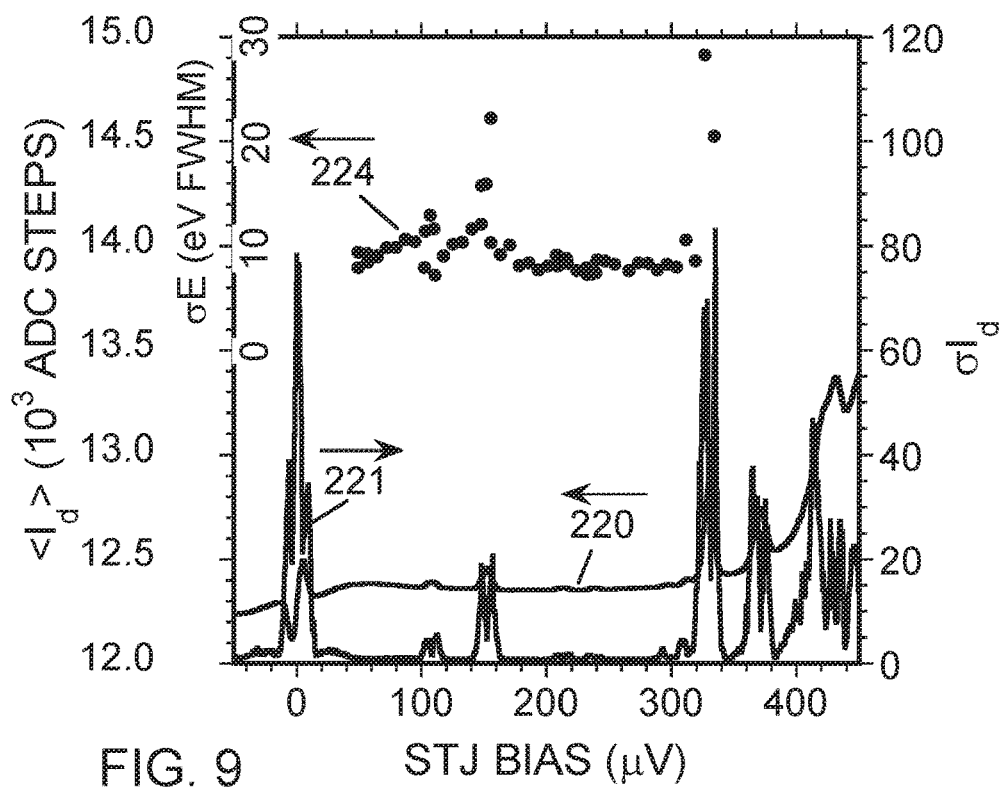
FIG. 9 repeats the measurements of FIG. 8 over a smaller bias voltage region and superimposes measurements of the detector's energy resolution.

FIG. 9 shows a subsection of FIG. 8's range, from −50 μV to +450 μV, scanned with smaller step sizes Δ$V_B$ and better precision (i.e. a larger value of NEND). In this case, with the exception of small Fiske modes at about 110 μV and 150 μV, the STJ current noise is very small all the way from about 40 μV to 300 μV, indicating that it should not be hard to locate a good operating point for this detector.

Overlaid on this plot, with an inset voltage scale running from 0 to 30 eV, is a series of measurements 224 of the STJ's energy resolution σE versus $V_B$, made at the 525 eV O-Kα x-ray line. These values show a good correspondence with the values in the σ$I_d$ noise curve—the peaks in σ$I_d$ and σE align nicely. This plot stresses the importance of being able to avoid Fiske modes when setting the STJ's operating point. While the best values of σE hover about 8 eV, at the 150 μV Fiske mode σE degrades to 22 eV and at the larger 330 μV Fiske mode, to 29 eV. Thus the resolution can easily degrade by factors of 3 to 4 if the operating point is not chosen properly. The excellent correspondence between the STJ noise curve (σ$I_d$) and energy resolution (σE) curve means that the former can be substituted for the latter in selecting an operating point. The importance of this point is emphasized by the fact that the noise curve was collected in about 1 minute, while it took just under 2 hours to collect the 50 points in the energy resolution curve at only 2 minutes per spectrum.

Figure 10:
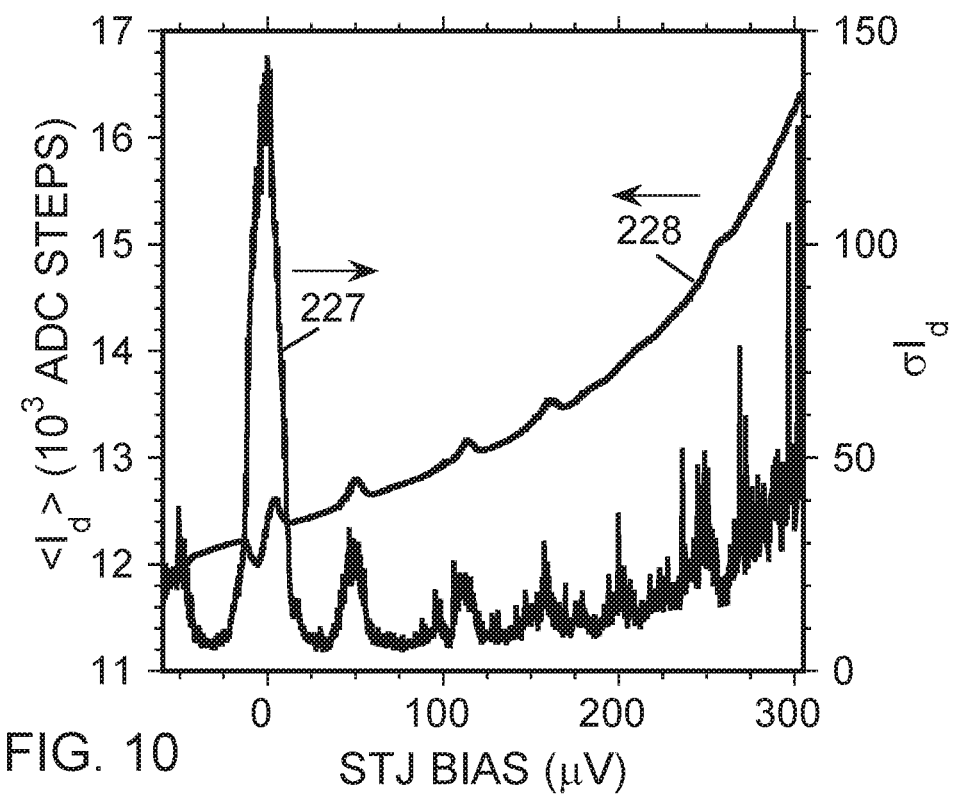
FIG. 10 shows an I-V curve and a Noise-V curve taken simultaneously from a large STJ detector using the circuit shown in FIG. 5.
Figure 11:
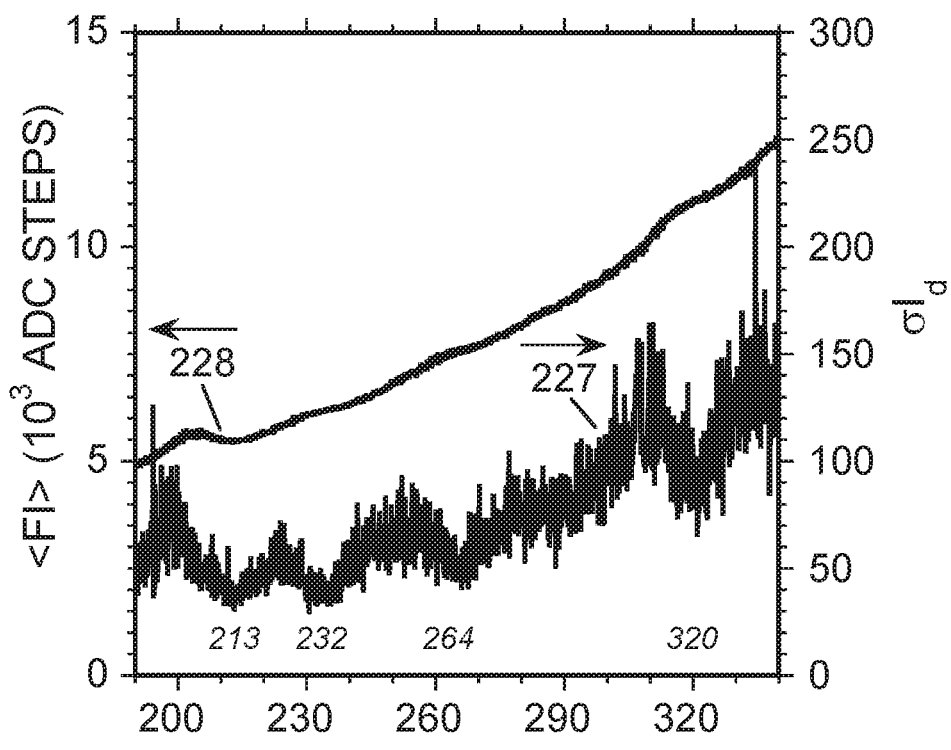
FIG. 11 repeats the measurements of FIG. 10 with higher accuracy over a restricted bias voltage region.

The detector shown in FIGS. 8 and 9 is a relatively easy case, with well separated Fiske modes, particularly in the 180 to 300 μV region. To further demonstrate the value of the disclosed technique we present data taken from a 200 μm×200 μm STJ. FIGS. 10 and 11 correspond to FIGS. 8 and 9, respectively, from the smaller STJ. This detector has several issues. First, because it is less well shielded magnetically, the <$I_d$> curve vs $V_B$ 228 rises much more steeply. Second, as a larger detector, its Fiske modes are much more closely spaced, making it harder to locate good operating points. Finally, probably because this detector has a Nb x-ray absorber, compared to Ta on the first device, it takes at least 150 μV of bias to achieve good quasi-particle collection and get good energy resolution.

Figure 12:
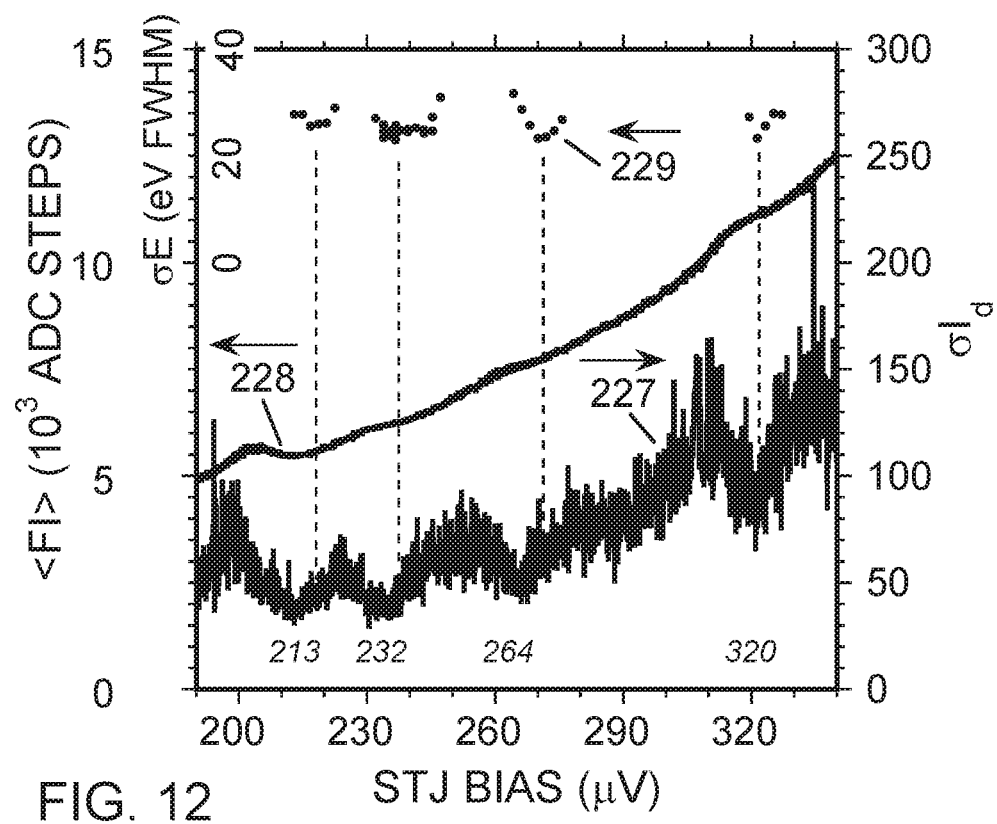
FIG. 12 repeats FIG. 11 with superimposed measurements of the detector's energy resolution.

FIG. 11 shows this region expanded. In this case we see that the standard "I/V" curve (i.e. <$I_d$> vs $V_B$) 228 is not particularly informative in this region. It shows a modest Fiske mode at about 205 μV and a suggestion of another at about 315 μV and is relatively smooth in between. The noise curve 227 is far richer, showing several maxima and minima in the "smooth" region. We located four minima, at 213, 232, 264, and 320 μV, and made local energy resolution measurements in their vicinity, again using 525 eV O-Kα x-rays, as shown in FIG. 12. Again, as expected, these σE curves 229 show local minima. They are also quite narrow, in some cases being only a few μV wide. The minima in the σE curves generally occur 2-3 μV above the minima in the σ$V_O$ noise curves, probably due to the preamplifier's finite inner loop gain. From these data, it is clear that the operating point at 232 μV is the preferred one, since its value of σE is as good as the others and its local minimum is much wider. In any case, this example shows the additional power that the disclosed STJ noise measurement method brings to the process of setting STJ operating points.

Applications

Initial Detector Setup

As is clear from the above descriptions, the disclosed method would be useful in establishing the initial operating point of an STJ detector or, even more so, the operating points of an array of STJ detectors. In either case, each individual STJ has its own preamplifier and digital x-ray processor, so that a single control computer can initiate noise measurements on all of the detectors either simultaneously, by broadcasting instructions to the x-ray processors at once, or in quick succession, by addressing the x-ray processors in turn, at a few milliseconds per command. Once the data collection(s) are complete, the computer can recover the I-V and noise curves from all the x-ray processors in rapid succession. For reference, using USB2, if the data words are 4 bytes and both the <$I_d$> and σ$I_d$ traces are 500 points long, it takes 100 μs to transfer them both. Capturing data from an entire array therefore requires less than 1 second, even for a 1000 element array. The noise traces can then be examined using simple pattern recognition schemes to locate reasonable operating points. One such pattern recognition scheme is to fit the data locally over 50 μV regions using a parabolic least squares fit, and select at the operating point the lowest found minimum that occurs above some preset value of $V_B$.

Monitoring During Data Collection

Because our preferred implementation captures FI samples only at times when signal pulses are not present in the processor, noise measurements can also be made while the detector is processing events. The desired samples are not hard to capture. Even at a counting rate of 20,000/second, if the signal pulse's duration is 20 μs, as shown in FIG. 1, the pulses are only present 40% of the time. Thus the inventive method can be extended to monitor the operating point during data collection. In this use, the bias voltage $V_{g1}$ 75 would be slowly stepped back and forth, making σ$I_d$ measurements over a small bias voltage range (e.g. ±5 μV) about the selected bias voltage $V_{b0}$. Then, for example, if the selected operating point were set at a local minimum in the σ$I_d$ curve, as for example at the 264 mV location on FIG. 11, the collected data can be analyzed to verify that $V_{b0}$ remains at the local minimum. If $V_{b0}$ is found to have drifted from the minimum, due to changes in the various operational amplifiers' offset voltages, for example, then it can be adjusted to the new minimum value without interrupting the data collection process.

Other Implementations

The heart of the disclosed invention is to measure the noise in the STJ's quiescent current $I_{d0}$ as a function of applied bias voltage by, for each member $V_{bi}$ of a set of STJ bias voltages, making a number of independent measurements of $I_d$, where making the measurement may involve applying a filter to $I_d$, calculating the average value $<I_d>_i$ and then calculating the standard deviation $\sigma I_{di}$ of the measurements about $<I_d>_i$, and, finally, storing the full set of $\{V_{bi}, <I_d>_i, \sigma I_{di}\}$ values for plotting, pattern recognition use, or other use. In our preferred implementation we attached a digital x-ray processor 160 to a preamplifier 150 whose applied bias was adjusted by a DAC 133 that could be controlled by the digital processor, and then inserted firmware into the processor's gate array 167 so that it could capture values of $I_{d,i}$ under control of the processor's onboard DSP 172, to which we added a piece of code the handle the collection of $I_{d,i}$ values and the calculation of $<I_d>_i$ and $\sigma I_{d,i}$.

However, using such electronic measurement tools as are currently available, the measurements could be carried out in a wide variety of other ways as well. For example, some digital x-ray processors, after the ADC 165, are implemented entirely in a single, powerful DSP such as the BlackFin from Analog Devices. In such a system, the logic shown in FIGS. 6 and 7 could readily be transferred to the DSP as well.

Also in our preferred implementation, both the preamplifier 150 and analog signal conditioning 162 are DC coupled so that the ADC samples a signal, $V_0$ 97 that is directly proportional to the detector current $I_d$. Many commercially available x-ray spectrometers, analog or digital, are AC coupled however. In this case $<I_d>$ is nominally zero, since the DC component of $I_d$ is blocked. However, because the AC components of $I_d$ are transmitted, the computation of $\sigma I_d$ produces exactly the same result as if the system were AC coupled and a plot of $\sigma I_d$ vs $V_b$ can still be used to locate useful detector operating points.

In other implementations, the digital x-ray processor could be replaced by an analog x-ray spectrometer and measurements made of its output—prior to the application of a multi-channel analyzer—which is a filtered representation of the STJ's current, the filter being the so-called "energy filter" or "slow channel filter" selected to extract energy values from the STJ's signal pulses. While not as practical as a computer controlled DAC, the bias-setting potentiometer $R_{S2}$ 62 in the prior art preamplifier shown in FIG. 3 could be replaced with a high precision dial potentiometer and the measurements of $V_3$ made with a precision voltmeter, recorded by hand, and $<I_{d0}>$ and $\sigma I_{d0}$ values computed on a calculator.

REFERENCES

The following references are incorporated by reference in their entirety:

U.S. Patent Documents

| | |
|---|---|
| WARBURTON-1997 | U.S. Pat. No. 5,684,850, issued Nov. 4, 1997 to W.K. Warburton and B. Hubbard for "Method and apparatus for digitally based high speed x-ray spectrometer." |
| WARBURTON-1998 | U.S. Pat. No. 5,774,522, issued Jun. 30, 1998 to W.K. Warburton for "Method and apparatus for digitally based high speed x-ray spectrometer for direct coupled use with continuous discharge preamplifiers." |
| WARBURTON -1999A | U.S. Pat. No. 5,870,051, issued Feb. 9, 1999 to W.K. Warburton and B. Hubbard for "Method and apparatus for analog signal conditioner for high speed digital x-ray spectrometer." |
| WARBURTON -1999B | U.S. Pat. No. 5,873,054, issued Feb. 16, 1999 to W.K. Warburton and Z. Zhou for "Method and apparatus for combinatorial logic signal processor in a digitally based high speed x-ray spectrometer." |

Other Publications

| | |
|---|---|
| FRIEDRICH-1997 | S. Friedrich et al., "Single Photon Imaging Spectrometers Using Low Noise Current Preamplifiers with DC Voltage Bias", IEEE Trans. Appl. Superconductivity 7 (1997) 3383-3386. |
| FRIEDRICH-2000 | S. Friedrich, M.F. Cunningham, M. Frank, S.E. Labov, At.T. Barkknecht, and S.P. Cramer, "Fiske modes in superconducting tunnel junction detectors, Nucl. Instr. & Methods in Phys. Research A444 (2000) 151-155. |
| FRIEDRICH-2006A | S. Friedrich, "Cryogenic X-ray detectors for synchrotron science", J. Synchrotron Radiation (2006) 13, 159-171. |
| FRIEDRICH-2006B | S. Friedrich, O.B. Drury, S.P. Cramer & G.G. Green, "A 36-pixel superconducting tunnel junction soft X-ray detector for environmental science applications", Nucl. Instr. & Methods in Phys. Research A559 (2006) 776-778. |
| FABRIS-1999 | L. Fabris, N.W. Madden & H. Yaver, "A fast, compact solution for low noise charge preamplifiers", Nucl. Instr. & Methods in Phys. Research A424 (1999) 545-551. |
| MEARS-1993 | C.A. Mears, S.E. Labov & A.T. Barfknecht, "Energy-resolving superconducting x-ray detectors with charge amplification due to multiple quasiparticle tunneling", Appl. Phys. Lett. 63 (1993) 2961-2963. |

CONCLUSION

While the above is a complete description of specific embodiments of the invention, the above description should not be taken as limiting the scope of the invention as defined by the claims.

What is claimed is:

1. A method of setting a superconducting tunnel junction (STJ) detector to a low noise operating point, the method comprising:
    adjusting the STJ's bias voltage $V_b$ in a series of consecutive steps across a range of bias voltages, and, at each step i,
        making multiple measurements of the current $I_d$ flowing through the STJ detector,
        calculating their mean, $<I_d>_i$, and calculating their standard deviation $\sigma i_{d,i}$ from the mean, $<I_d>_i$, and
    recording pairs of values $\{V_b, \sigma_d\}_i$ so determined, as a "noise curve"; then
    setting the STJ to a low noise operating point by adjusting the STJ's bias voltage $V_b$ to a voltage that is within a region of low $\sigma I_d$ in the noise curve.

2. The method of claim 1, and further comprising, with each pair of values $\{V_b, \sigma I_d\}_i$ recorded, also recording the associated value $<I_d>_i$.

3. The method of claim 1, further comprising identifying peaks in the noise curve as locations of Fiske modes.

4. The method of claim 1, wherein at each step i, the method comprises:
converting each measurement of the current $I_d$ into an output voltage $V_O$ that is proportional to $I_d$,
capturing a digitized value FI of each output voltage $V_O$, and
calculating the standard deviation σFI of the digitized values FI as a function of the bias voltage $V_b$.

5. The method of claim 1 which includes comparing the noise curve to a curve of energy resolution of the STJ detector versus applied bias voltage in order to determine which of the located regions will provide the best energy resolution.

6. The method of claim 1 wherein making a measurement of the current $I_d$ includes applying a filter to $I_d$.

7. The method of claim 6, wherein the filter is a digital filter of the form $$F_i(I) = \sum_{j=i-K}^{i} I_j - \alpha \sum_{j=i-2K}^{i-K-1} I_j$$

where $F_i(I)$ is the filter output at time step i, a is a constant, and the $I_j$ are digitized values of the current $I_d$ at earlier time steps j.

8. The method of claim 1 wherein measurements of the current $I_d$ are made using electronics attached to the STJ that include a preamplifier that sets the bias voltage $V_b$ on the STJ using a digital-to-analog converter.

9. The method of claim 8 wherein the electronics also include a digital processor that can control the bias voltage $V_b$ on the STJ by sending data to the digital-to-analog converter.

10. The method of claim 1 comprising measuring $I_d$ only when the STJ is in quiescent mode and not emitting a current signal pulse due to absorption of energy from a photon or particle.

11. A method of setting the operating point of a superconducting tunnel junction (STJ) detector, the method comprising:
operably connecting to the STJ a preamplifier that converts current $I_d$ flowing through the STJ into an output voltage $V_O$ that is proportional to $I_d$, and that further adjusts the STJ's bias voltage $V_b$ by means of a digital-to-analog converter;
operably connecting to the preamplifier a digital x-ray processor (DXP) that receives the preamplifier's output $V_O$ and transmits data to a digital-to-analog converter;
providing processing logic in the DXP that, on command, captures a digitized value FI of the preamplifier's output $V_O$;
providing control logic in the DXP that calculates the standard deviation (σFI) of captured values of FI as a function of bias voltage ($V_b$); and
thereafter setting a low noise operating point for the STJ where the bias voltage $V_b$ is within a region of low σ$I_d$ in the noise curve.

12. The method of claim 11 wherein the control logic in the DXP that measures the standard deviation (σFI) of captured values of FI as a function of bias voltage ($V_b$), operates so that, for each member $V_{b,i}$ in a sequence of bias voltage values, it:
sets the bias voltage value $V_{b,i}$ on the STJ using the digital-to-analog converter;
causes a set of values of FI to be captured;
averages the values of FI to obtain their mean <FI>$_i$;
computes the standard deviation σFI$_i$ of the set of FI values about <FI>$_i$; and
stores the values of $V_b$ and σFI to produce the noise curve.

13. The method of claim 12 wherein, when the DXP stores the values of $V_b$ and σFI, it also stores the value of <FI>.

14. The method of claim 13 wherein both the preamplifier and DXP are DC coupled, so that the stored sets of $V_{b,i}$ and <FI>$_i$ values constitute a representation of the STJ's I-V curve.

15. The method of claim 12 wherein capturing the value FI includes applying a digital filter to the preamplifier's output.

16. The method of claim 15 wherein the digital filter has the form $$F_i(I) = \sum_{j=i-K}^{i} I_j - \alpha \sum_{j=i-2K}^{i-K-1} I_j$$

where $F_i(I)$ is the filter output at time step i, a is a constant, and the $I_j$ are digitized values of the preamplifier's output at earlier time steps j.

17. The method of claim 12 wherein the DXP control logic is invoked by an external computer and generated pairs of $V_b$ and σFI$_i$ values are transmitted to the external computer.

18. The method of claim 12 where the DXP processing logic also assures that the DXP is not also processing an STJ output signal pulse at the time of the capture of the value FI.

19. Apparatus for determining locations of Fiske modes as a function of bias voltage across identifying a low-noise operating point for a superconducting tunnel junction (STJ) detector, the apparatus comprising:
a preamplifier, operably connectable to the STJ, wherein the preamplifier converts current $I_d$ flowing through the STJ into an output voltage $V_O$ that is proportional to $I_d$, and that further adjusts the STJ's bias voltage $V_b$ by means of an associated digital-to-analog converter;
a digital x-ray processor (DXP), operably connectable to the preamplifier, that receives the preamplifier's output $V_O$ and transmits data to its associated digital-to-analog converter;
processing logic in the DXP that, on command, captures a digitized value FI of the preamplifier's output $V_O$; and
control logic in the DXP that:
calculates the standard deviation (σFI) of captured values of FI as a function of bias voltage ($V_b$), and generates a plot of σFI versus $V_b$ (a "noise curve");
wherein a region of low σ$I_d$ in the noise curve identifies said low-noise operating point.

20. The apparatus of claim 19 wherein the control logic in the DXP that measures the standard deviation (σFI)$_i$ of captured values of FI as a function of bias voltage ($V_{b,i}$), operates so that, for each member $V_{b,i}$ in a sequence of bias voltage values, it:
sets the bias voltage value $V_{b,i}$ on the STJ using the digital-to-analog converter;
causes a set of values of FI to be captured;
averages the values of FI to obtain their mean <FI>$_i$;
computes the standard deviation σFI$_i$ of the set of FI values about <FI>$_i$; and stores the values of $V_{b,i}$ and σFI i to produce the noise curve.

21. The apparatus of claim 20 wherein, when the DXP stores the values of $V_{bi}$ and σFI$_i$, it also stores the value of <FI>$_i$.

22. The apparatus of claim 21 wherein both the preamplifier and DXP are DC coupled, so that the stored sets of $V_b$ and <FI> values constitute a representation of the STJ's I-V curve.

23. The apparatus of claim 20 wherein capturing the value FI includes applying a digital filter to the preamplifier's output.

24. The apparatus of claim 23 wherein the digital filter has the form $$F_i(I) = \sum_{j=i-K}^{i} I_j - \alpha \sum_{j=i-2K}^{i-K-1} I_j$$

where $F_i(I)$ is the filter output at time step i, α is a constant, and the $I_j$ are digitized values of the preamplifier's output at earlier time steps j.

25. The apparatus of claim 20 wherein the DXP control logic is invoked by an external computer and generated pairs of $V_b$ and σFI values are transmitted to the external computer.

26. The apparatus of claim 20 wherein the DXP processing logic also assures that the DXP is not also processing an STJ output signal pulse at the time of the capture of the value FI.

27. A method for setting a superconducting tunnel junction (STJ) detector to a low noise operating point, the method comprising:

providing a preamplifier that is configured to reproducibly set bias voltage $V_b$ applied to the STJ, and to convert current $I_d$ flowing through the STJ into a measurable voltage $I_d$ that is proportional to $I_d$;

operably connecting to the preamplifier a device configured to measure the voltage $I_d$;

using the preamplifier to step $V_b$ across a range of possible operating voltages, and, at each step i, measuring the standard deviation σ$I_d$ of $I_d$, and recording at least some of the pairs {$V_b$, σ$I_d$} so determined as a noise curve; then examining the noise curve to locate local minima or regions of low σ$I_d$; and setting the STJ to a low noise operating point by adjusting the bias voltage $V_b$ of the STJ detector to a value that is within a region of low σ$I_d$ in the noise curve.

* * * * *